(12) United States Patent
Popovic et al.

(10) Patent No.: US 7,259,556 B2
(45) Date of Patent: Aug. 21, 2007

(54) MAGNETIC FIELD SENSOR AND METHOD FOR OPERATING THE MAGNETIC FIELD SENSOR

(75) Inventors: Radivoje Popovic, St-Sulpice (CH); Christian Schott, Lussy-sur-Morges (CH)

(73) Assignee: Melexis Technologies SA, Bevaix (CH)

( * ) Notice: Subject to any disclaimer, the term of this patent is extended or adjusted under 35 U.S.C. 154(b) by 227 days.

(21) Appl. No.: 10/522,976

(22) PCT Filed: Jul. 29, 2003

(86) PCT No.: PCT/EP03/50342

§ 371 (c)(1),
(2), (4) Date: Feb. 1, 2005

(87) PCT Pub. No.: WO2004/013645

PCT Pub. Date: Feb. 12, 2004

(65) Prior Publication Data

US 2006/0164080 A1    Jul. 27, 2006

(30) Foreign Application Priority Data

Aug. 1, 2002    (CH)    .......... PCT/CH02/00428 WOX
Sep. 16, 2002   (CH)    .......... PCT/CH02/00507 WOX

(51) Int. Cl.
*G01R 33/025*    (2006.01)
*G01R 35/00*     (2006.01)

(52) U.S. Cl. .................. 324/244; 324/202; 324/260

(58) Field of Classification Search ................ 324/244, 324/247, 249, 251, 252, 253, 254, 255, 259, 324/260, 117 H, 202
See application file for complete search history.

(56) References Cited

U.S. PATENT DOCUMENTS 3,638,074 A    1/1972 Inouye
4,059,798 A *  11/1977 Dierker et al. ............... 324/127

(Continued)

FOREIGN PATENT DOCUMENTS

EP    1 052 519 A1    11/2000

(Continued)

*Primary Examiner*—Edward Lefkowitz
*Assistant Examiner*—Kenneth J Whittington
(74) *Attorney, Agent, or Firm*—McCormick, Paulding & Huber LLP

(57) ABSTRACT

A magnetic field sensor for the measurement of at least one component of a magnetic field comprises a ferromagnetic core that serves as a magnetic field concentrator, an excitation coil and a read-out sensor. The read-out sensor preferably comprises two sensors arranged in the vicinity of the outer edge of the ferromagnetic core and measures the at least one component of the magnetic field. The ferromagnetic core is ring-shaped or disc-shaped. On operation of the magnetic field sensor, a current is temporarily applied to the excitation coil in order to bring the ferromagnetic core into a state of predetermined magnetization in which the magnetization of the ferromagnetic core produces no signal in the read-out sensor.

20 Claims, 4 Drawing Sheets

U.S. PATENT DOCUMENTS

Figure 1:
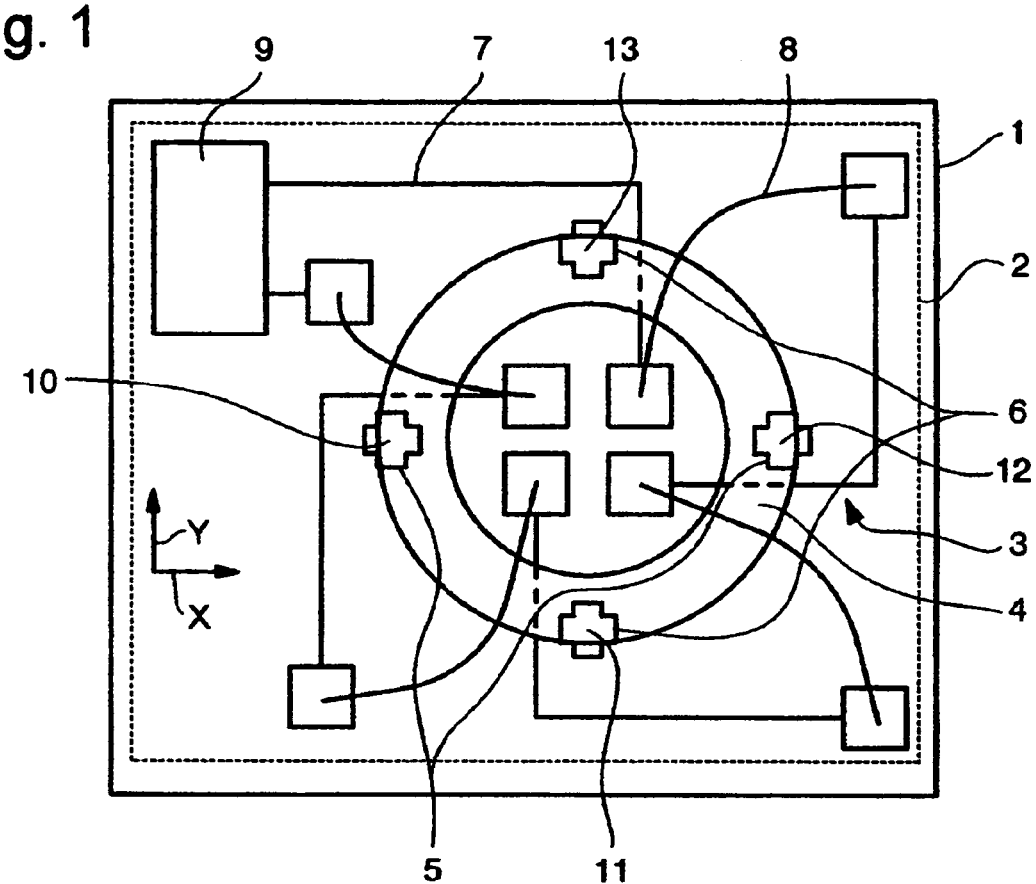

| | | | |
|---|---|---|---|
| 4,692,703 A * | 9/1987 | Extance et al. | 324/251 |
| 4,849,696 A * | 7/1989 | Brun et al. | 324/252 |
| 4,963,827 A * | 10/1990 | Popovic et al. | 324/251 |
| 5,199,178 A * | 4/1993 | Tong et al. | 33/361 |
| 5,583,429 A * | 12/1996 | Otaka | 324/127 |
| 5,982,176 A * | 11/1999 | Kawamura et al. | 324/252 |
| 6,404,192 B1 | 6/2002 | Chiesi et al. | |
| 6,407,547 B1 * | 6/2002 | Yamada et al. | 324/253 |
| 6,545,462 B2 | 4/2003 | Schott et al. | |
| 6,750,644 B1 * | 6/2004 | Berkcan | 324/117 R |
| 7,038,448 B2 * | 5/2006 | Schott et al. | 324/251 |
| 2004/0232913 A1 | 11/2004 | Schott et al. | |

FOREIGN PATENT DOCUMENTS

| | | |
|---|---|---|
| EP | 1 182 461 A2 | 2/2002 |
| GB | 2 315 870 A | 8/1996 |
| WO | WO 02/97463 A2 | 12/2002 |

* cited by examiner

MAGNETIC FIELD SENSOR AND METHOD FOR OPERATING THE MAGNETIC FIELD SENSOR

CROSS REFERENCE TO RELATED APPLICATIONS

The present application is related to and claims priority of the PCT application number PCT/EP03/50342 of Sentron AG entitled Magnetic field sensor and method for operating the magnetic field sensor, filed on Jul. 29, 2003, the disclosure of which is herein incorporated by reference, which in turn claims priority of the PCT applications number PCT/CH02/00428 filed Aug. 1, 2002 and PCT/CH02/00507 filed Sep. 16, 2002.

FIELD OF THE INVENTION

The invention concerns a magnetic field sensor and a method for operating a magnetic field sensor of the type named in the preamble of claim 1.

Such magnetic field sensors are suitable for the measurement of magnetic fields the strength of which amounts only to some nT to mT, for example as a compass for measuring the direction of the earth's magnetic field.

BACKGROUND OF THE INVENTION

A magnetic field sensor for measuring magnetic fields is known from EP 1 182 461. The magnetic field sensor is suitable for determining the direction of a two-dimensional magnetic field. The magnetic field sensor comprises a magnetic field concentrator with a flat shape and two sensors that comprise at least one Hall element, whereby the Hall elements are arranged in the area of the edge of the magnetic field concentrator. The first sensor measures a first component of the magnetic field and the second sensor measures a second component of the magnetic field. The direction of the magnetic field can therefore be determined from the signals of the two sensors.

A further magnetic field sensor for determining the direction of a magnetic field is known from EP 1 052 519. The magnetic field sensor comprises a ferromagnetic core in the form of a cross, an excitation coil for periodically saturating the ferromagnetic core, and read-out coils. The magnetic field sensor is operated as a flux gate sensor. The disadvantage with such a sensor is that a relatively high current is necessary for the magnetic saturation of the ferromagnetic core. Such a magnetic field sensor is therefore not suitable for applications with battery operation.

A further magnetic field sensor for determining the strength of a magnetic field is known from GB 2315870. The magnetic field sensor comprises a ferromagnetic core in the form of a ring, an excitation coil in order to periodically saturate the ferromagnetic core and read-out coils. Furthermore, in one design type, the sensor comprises additional ferromagnetic cores that work as external magnetic field concentrators. To reduce a possible residual magnetism of these additional cores, additional coils are present to which current is periodically applied in order to demagnetize the additional cores.

The object of the invention is to develop a magnetic field sensor with which magnetic fields can be measured the strength of which only amounts to some nT to mT even when power is supplied by a battery without the battery having to be frequently changed.

Investigations have revealed that a significant problem exists in that the ferromagnetic core serving as magnetic field concentrator can be magnetized or the magnetization can be reversed to such an extent by an external, for example temporarily occurring magnetic interference field, that the ferromagnetic core becomes a magnetic dipole that produces a signal in the read-out coils. Here, the invention provides a remedy in that the ferromagnetic core is brought into a state of predetermined magnetization by applying a magnetic field at selected times. A coil is provided for producing the magnetic field. The magnetic field produced by the current flowing through the coil must be large enough that the magnetic reversal of the ferromagnetic core caused by the interference field can be cancelled. In doing so, the necessary current intensity is dependent on the magnetization curve of the ferromagnetic core.

A magnetic field sensor in accordance with the invention for the measurement of at least one component of a magnetic field comprises a ring-shaped ferromagnetic core that serves as a magnetic field concentrator, an excitation coil and a read-out sensor. The read-out sensor comprises at least one, preferably two sensors arranged in the vicinity of the outer edge of the ferromagnetic core and measures the at least one component of the magnetic field. On operation of the magnetic field sensor, a current is temporarily applied to the excitation coil at selected times in order to bring the ferromagnetic core into a state of predetermined magnetization in which the magnetization of the ferromagnetic core produces no signal in the read-out sensor. The current flowing through the excitation coil must be large enough so that the magnetic field produced by the current in the ferromagnetic core achieves at least the coercive field strength given by the material of the ferromagnetic core. Preferably, the current is selected so high that the magnetic field produced by it is two to three times greater than the coercive field strength. If the material has a so-called hard and a soft magnetic axis, then the greater coercive field strength of the hard magnetic axis has to be selected. With this process, the ring-shaped ferromagnetic core is magnetized for example in such a way that the field lines within the core run as closed field lines in tangential direction. This magnetization is called circular magnetization. By means of this predetermined magnetization, the problem of the previously mentioned residual magnetization that leads to errors is solved.

This process of bringing the ferromagnetic core into a state of predetermined magnetization is preferably carried out before an actual measurement of the external magnetic field. It can however be carried out periodically or at any other time. The ferromagnetic core is thus magnetized with a predetermined magnetization and this predetermined magnetization is refreshed or restored at specific times.

In order to bring the ferromagnetic core into the desired state of magnetization, a certain amount of magnetization energy is necessary. The required magnetization energy is, on the one hand proportional to the volume V of the ferromagnetic core and, on the other hand to the magnetic product B×H that is dependent on the hysteresis curve of the material used. In order to get the smallest possible magnetic product, a soft magnetic material, eg, Vitrovac 6025Z is selected as the material for the ferromagnetic core. The volume to be magnetized is determined by the geometry of the ferromagnetic core. Because the achievable magnetic amplification is mainly determined by the diameter of the ring-shaped ferromagnetic core, the width and thickness of the ring are selected as small as possible. For the above-mentioned material Vitrovac 6025Z, with a ring diameter of 1 mm for example, a width of 20_m and a height of 10_m are selected. The width therefore amounts to only two percent of the diameter of the ring. It makes sense when the width and height of the ring are as small as is possible as the used technology allows it. When using other technologies such as for example attaching the core to a semiconductor chip by means of electrolysis or sputtering, the thickness of the core can be reduced to one micrometer or less.

A further advantage of reducing the volume of the core exists in that the build up of the premagnetization by means of a magnetic field produced by the coil is itself less inhibited by eddy currents produced in the core. In this way, the current pulse for magnetization can be shorter and the total required energy reduced. A sensor optimised in this way is also suitable for applications with little admissible energy consumption such as a watch for example.

The magnetic field sensor can be used for example in order to measure the strength of a weak magnetic field the direction of which does not change. Such a magnetic field sensor can also be used as a current or energy sensor whereby it measures the strength of a magnetic field produced by a conductor with current flowing through it. In addition, the sensor can have a second read-out sensor in order to measure a second component of an external magnetic field. When two components of the external magnetic field are measured, then its direction can also be determined from them. Such a magnetic field sensor can therefore also be used as a compass.

In the following, three embodiments of the invention are explained in more detail based on the drawing.

BRIEF DESCRIPTION OF THE DRAWING FIGURES

Figure 2:
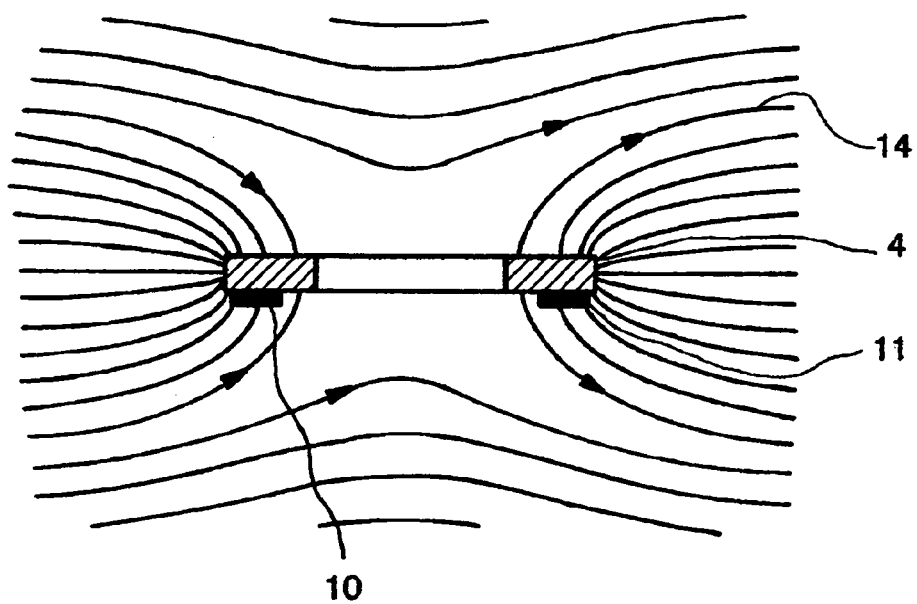
Figure 3:
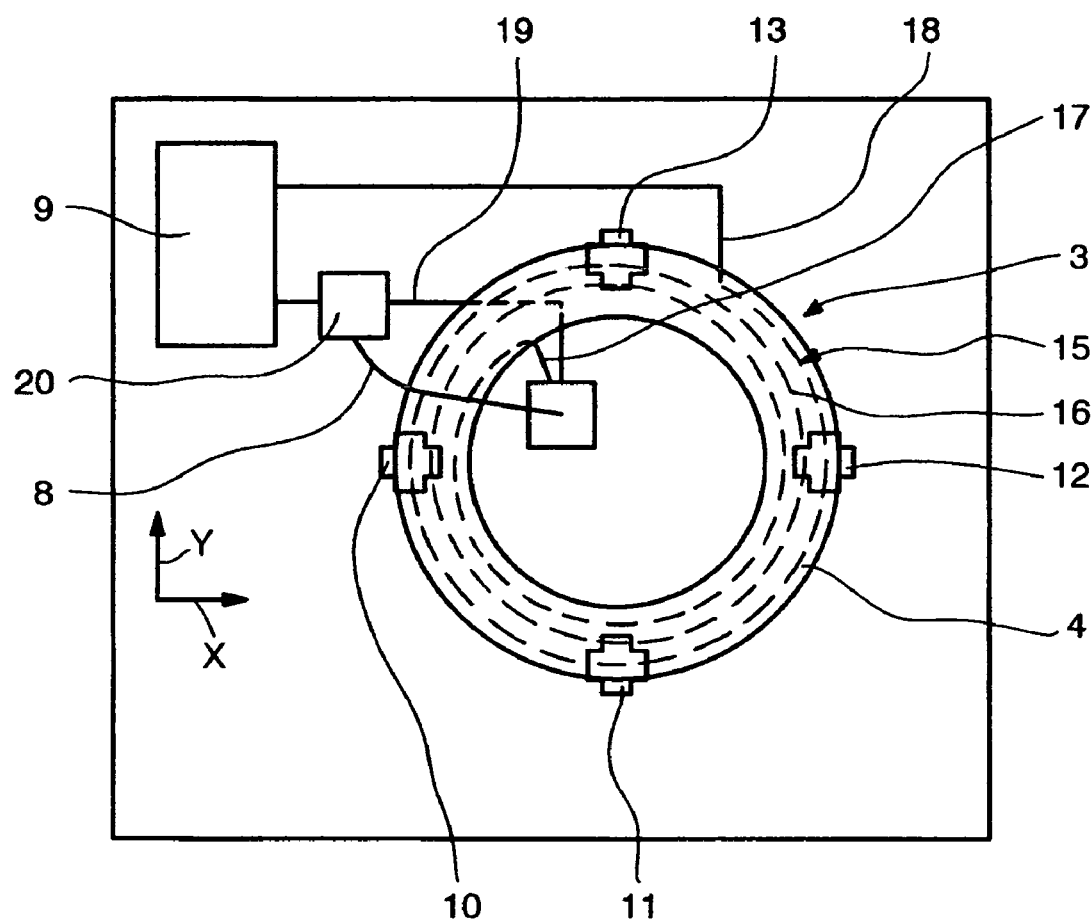
Figure 4A:
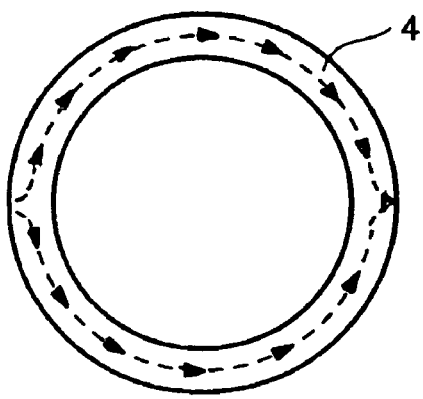
Figure 4B:
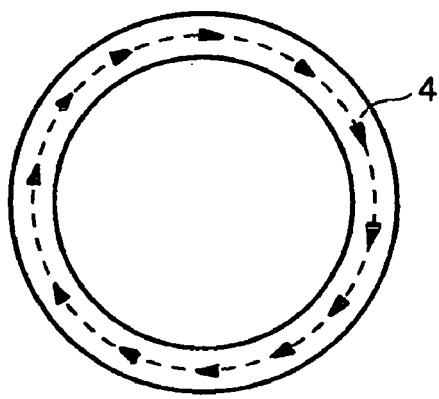
Figure 5:
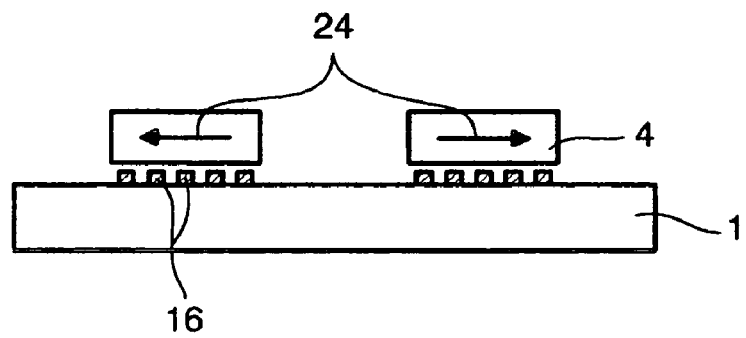
Figure 6:
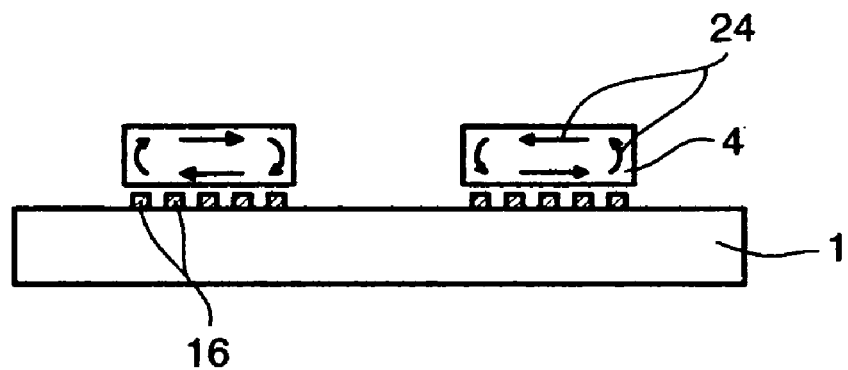
Figure 7:
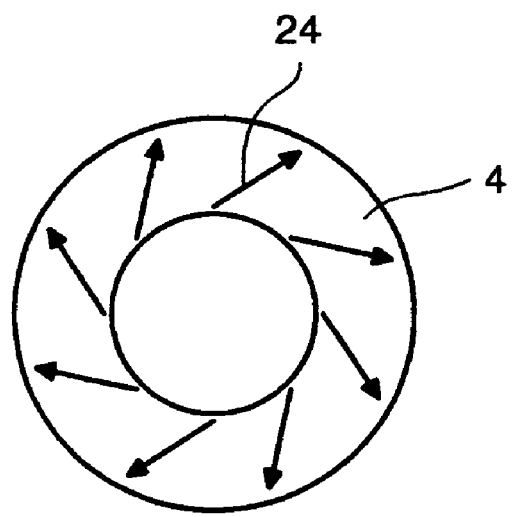

FIG. 1 shows a plan view of a magnetic field sensor for the measurement of two components of an external magnetic field, with a ring-shaped ferromagnetic core, FIG. 2 shows a cross-section of the magnetic field sensor and field lines, FIG. 3 shows a further magnetic field sensor, FIGS. 4A, 4B shows the ring-shaped core in different states of magnetization, FIGS. 5, 6 shows the course of magnetic field lines in the ferromagnetic core, and FIG. 7 shows a ring-shaped ferromagnetic core that is magnetized in a specific way.

DETAILED DESCRIPTION OF THE PREFERRED EMBODIMENTS

Embodiment 1

FIG. 1 shows a plan view of a magnetic field sensor formed as a semiconductor chip 1 for the measurement of two components of an external magnetic field. A Cartesian system of x, y, z co-ordinates serves as reference system the origin of which in the figure, for reasons of illustrative clarity, is arranged outside the magnetic field sensor, whereby the z direction runs vertically to the plane of projection. The magnetic field sensor comprises an electronic circuit 2, an excitation coil 3 to which current can be applied with, for example, four turns, a ring-shaped ferromagnetic core 4 and two read-out sensors 5, 6. The ferromagnetic core 4 extends in a plane and therefore defines the position of the xy plane. The read-out sensor 5 serves the acquisition of the x component of the magnetic field, the read-out sensor 6 serves the acquisition of the y component of the magnetic field. The read-out sensors 5, 6 consist preferably of two locally separated but electrically connected sensors. The magnetic field sensor is manufactured using a technology with which the electronic circuit 2, parts of the excitation coil 3 and the read-out sensors 5, 6 are produced first with a standard CMOS technology and then the ferromagnetic core 4 is applied in a so-called post-process. In doing so, a tape of amorphous ferromagnetic material is adhered to the wafer with the semiconductor circuits and structured by means of photolithography and chemical etching. After sawing the wafer into the individual semiconductor chips, the turns of the excitation coil 3 are completed on mounting the semiconductor chip onto a substrate either by wire bonding (as shown) or by means of the flip-chip technology. The electronic circuit 2 serves to produce the current flowing through the excitation coil 3 and to evaluate the signals delivered by the read-out sensors 5, 6.

With the embodiment shown in FIG. 1, the excitation coil 3 has four turns that consist partially of conductor paths 7 and partially of bond wires 8. The conductor paths 7 run underneath and the bond wires 8 run above the ferromagnetic core 4. The bond wires 8 connect one end of a conductor path 7 to one end of another conductor path 7. A circuit 9 serves to temporarily apply a current I(t) to the excitation coil 3 in order to bring the ferromagnetic core 4 into a state of predetermined magnetization. The variable t designates the time.

The electronic circuit 2 is supplied with energy by a not presented energy source, in particular a battery. The electronic circuit 2 serves to operate the circuit 9, the read-out sensors 5, 6 and the evaluation of the signals delivered by the read-out sensors 5, 6.

The tape made of amorphous metal available under the designation VAC 6025Z serves for example as material for the ferromagnetic core 4. This material has a coercive field strength of $H_C=3$ mA/cm. In order to magnetically saturate the ferromagnetic core 4, the current I flowing through the excitation coil 3 should produce a magnetic field $H_S$ that is around 20 times greater than the coercive field strength $H_C$. When the outer diameter D of the ring-shaped ferromagnetic core 4 is D=1 mm and the number n of the tuns of the excitation coil 3 amounts to n=4, then, according to the equation $$I=20*H_C*D*\pi/n \tag{1}$$

one gets I≅4.5 mA for the current. Because the ferromagnetic core 4 has no air gap it can be magnetically saturated by means of a small magnetic field and therefore by means of a low current I.

As read-out sensors 5 and 6, the magnetic field sensor preferably has four so-called horizontal Hall elements 10, 11, 12 and 13 coupled in pairs that are sensitive to a magnetic field that runs vertically to the surface of the semiconductor chip 1, ie, that runs in z direction. The Hall elements 10 and 12 are arranged on the x-axis of the Cartesian system of co-ordinates and form the first read-out sensor 5. The Hall elements 10 and 12 are therefore arranged at diametrically opposite locations in relation to a symmetrical axis running through the centre of the ferromagnetic core 4. The Hall elements 11 and 13 are arranged on the y-axis of the Cartesian system of co-ordinates and form the second read-out sensor 6. The horizontal Hall elements 10 to 13 are always arranged underneath the ferromagnetic core 4 in the vicinity of its outer edge. Because the relative permeability $\mu_r$ of the ferromagnetic core 4 is very large in relation to the relative permeability of its surroundings, the field lines of the external magnetic field to be measured impinge almost orthogonally on the surface of the ferromagnetic core 4 or leave it at almost a orthogonal angle. The field concentration is greatest in the area of the outer edge of the ferromagnetic core 4 where the Hall elements 10 to 13 are located. The output signals of the two Hall elements 10 and 12 are dependent on the strength of the x component of the external magnetic field, the output signals of the two Hall elements 11 and 13 are dependent on the strength of the y component of the external magnetic field.

FIG. 2 shows the field lines 14 of the external magnetic field when the ferromagnetic core 4 is not saturated by the magnetic field produced by the current flowing through the excitation coil 3 (FIG. 1). The field lines at the locations of the two Hall elements 10 and 12 point in different directions because the magnetic field enters the ferromagnetic core 4 at the location of one of the Hall elements, for example Hall element 10, and leaves it again at the location of the other Hall element 12. The two Hall elements 10 and 12 are electrically interconnected as read-out sensor 5 (FIG. 1) in such a way that the Hall voltages produced by the x component of the external magnetic field in the Hall elements 10 and 12 are added. However, any z component of the external magnetic field present at the two Hall elements 10 and 12 points in the same z direction and therefore causes no output signal in the read-out sensor 5.

It is advantageous not to permanently electrically interconnect the two Hall elements 10 and 12 as read-out sensor 5 but in such a way that the output signals of the two Hall elements 10 and 12 are alternatively added or subtracted. In this way either the x component or the z component of the external magnetic field can be measured with the read-out sensor 5 corresponding to the momentary electrical interconnection of the two Hall elements 10 and 12. For measurement of the z component of the magnetic field a separate Hall element can however also be provided that is not located in the vicinity of the edge of the ferromagnetic core 4 so that neither the x component nor the y component of the magnetic field contribute to its Hall voltage.

Each of the read-out sensors 5 and 6 can however also comprise of only one Hall element, the read-out sensor 5 for example of Hall element 10 and the read-out sensor 6 of Hall element 11 when the z component of the magnetic field is negligibly small in relation to the x and y components of the magnetic field amplified by the ferromagnetic core 4. In this case, for measurement of the z component of the magnetic field a separate Hall element is to be provided that is not located in the vicinity of the edge of the ferromagnetic core 4.

The excitation coil 3 (FIG. 1) serves to bring the ferromagnetic core 4 into a state of predetermined magnetization at specific times. Here it is basically a case of magnetizing the ferromagnetic core 4 in such a way that its magnetization produces no signal in the read-out sensors 5, 6. Coincidental magnetization of the ferromagnetic core 4 caused by external influence that produces an undesired signal in the read-out sensors 5, 6 is thereby neutralised.

The ferromagnetic core 4 is magnetized in such a way that the magnetic field produced by its magnetization produces no signal in the read-out sensors 5, 6. This means that any components of this magnetic field run either orthogonally to the sensitivity direction of the Hall elements 10 to 13 or they run in the Hall elements 10, 11, 12 and 13 connected in pairs as read-out sensors 5, 6 in the same z direction so that the Hall voltages produced by them are compensated.

In the following, further measures are now described the application of which lead to increased sensitivity of the magnetic field sensor and/or to lower current or energy consumption.

When the number of turns of the excitation coil 3 is increased to n, then either the current flowing through the excitation coil 3 can be reduced by the factor n or the diameter D of the ring-shaped ferromagnetic core 4 can be increased by the factor n and, in accordance with the equation (1), on magnetization one gets the same degree of saturation of the ferromagnetic core 4. An increase in the diameter D of the ferromagnetic core 4 causes an amplification of the flow concentration but increases the space requirement and therefore the dimensions of the semiconductor chip 1. With a view to the aim of the greatest possible miniaturisation of the magnetic field sensor, optimum conditions then result when the diameter D of the ferromagnetic core 4 is adapted to the dimensions of the semiconductor chip 1 as are given by the space requirements for the electronic circuit 2 and the number n of turns of the excitation coil 3 is adapted to the size of the ferromagnetic core 4.

Embodiment 2

FIG. 3 shows a plan view of a further magnetic field sensor with a ring-shaped ferromagnetic core 4 with which the excitation coil 3 is formed as a flat coil 15 with a spiral conductor path 16 that is arranged underneath the ferromagnetic core 4. The conductor path 16 runs spirally but nevertheless almost concentrically to the ferromagnetic core 4.

A first end 17 of the conductor path 16 is naturally located within, a second end 18 of the conductor path 16 outside the ring-shaped ferromagnetic core 4. A conductor path 19 arranged in a second metallisation layer connects the first end 17 with a connection 20 arranged outside the ring-shaped ferromagnetic core 4. (The bond wire 8 also illustrated is not present for the second embodiment but is important for the third embodiment.) The conductor path 19 is therefore located on the same side of the ferromagnetic core 4 as the flat coil 15. Although the conductor path 16 of the flat coil 15 runs spirally, parts of the conductor path 16 running in radial direction do not contribute to the magnetic field produced by the flat coil 15 as the current flowing in the conductor path 19 flows in the opposite direction to the current flowing in radial direction through the flat coil 15 and therefore compensates it. The magnetic field produced by the flat coil 15 therefore corresponds to a magnetic field produced by concentrically arranged conductor paths.

Embodiment 3

This example largely corresponds to the second embodiment but instead of the conductor path 19, the bond wire 8 is present that connects the first end 17 of the flat coil 15 with a connection 20 arranged outside the ring-shaped ferromagnetic core 4. Because the flat coil 15 and the bond wire 8 cross the ferromagnetic core 4 on different sides, namely the flat coil 15 underneath and the bond wire 8 above, the result is a supplementary coil with one single winding that encloses the ring of the ferromagnetic core 4 and works as an excitation coil in accordance with the first embodiment. In contrast to the second embodiment, the current flowing through the bond wire 8 does not compensate the current flowing in radial direction through the flat coil 15. The combination of flat coil 15 and bond wire 8 represents an excitation coil 3 with which the ferromagnetic core 4 can be brought into a state of predetermined magnetization in a very efficient way in which the magnetization of the core 4 produces no signal in the read-out sensors 5, 6.

In the following at least one first method is described for the three embodiments in order to bring the ferromagnetic core 4 into a state of predetermined, non-vanishing magnetization. The methods are preferably carried out before a measurement of the x and y components of the external magnetic field is carried out with the magnetic field sensor unless the magnetic field that is produced temporarily by the current flowing through the excitation coil 3 while carrying out the methods produces no signal in the read-out sensors 5, 6.

The following methods 1.1 and 2.1 relate to the first embodiment and their effects are described for the first embodiment whereby the terms and references relate to the figures assigned to the first embodiment.

Method 1.1

With this first method, a current I(t) is applied to the excitation coil 3 for a predetermined time duration in order to uniformly magnetize the ferromagnetic core 4. The magnetic field B(t) produced by the current I(t) flowing through the excitation coil 3 runs along concentric, closed lines in the ferromagnetic core 4. This magnetic field is designated as a circular magnetic field. The current I(t) is for example a direct current pulse the strength of which first increases and is then reduced to zero. In order that a magnetization caused through outer influences can be completely neutralised, the direct current I(t) is preferably increased until the ferromagnetic core 4 is magnetically saturated or is almost magnetically saturated and then reduced again to zero. The maximum of the direct current I(t) produces a magnetic field in the ferromagnetic core 4 the magnetic field strength of which is greater, preferably twice or three times greater, than the coercive field strength $H_c$ of the material of the ferromagnetic core 4. The maximum of the direct current I(t) should be selected so high that a magnetic reversal of the ferromagnetic core 4 caused by an interference field can be neutralised. In doing so, the necessary current strength is dependent on the magnetization curve of the ferromagnetic core 4. In this way, the ferromagnetic core 4 is magnetized whereby its magnetization corresponds roughly to the remanence of the ferromagnetic material. The ring-shaped structure of the ferromagnetic core 4 of the first embodiment offers the advantage that the field lines of the magnetic field produced by its magnetization close inside the ferromagnetic core 4. The magnetic field produced by the magnetization outside the ferromagnetic core 4 runs orthogonally to the sensitivity direction of the Hall elements 10-13 and therefore produces no Hall voltage.

FIG. 4A shows with broken lines the course of the field lines after the ring-shaped core 4 has been magnetized by an outer magnetic interference field. Arrows indicate the direction of the field. The ring-shaped core works as a magnetic dipole and produces an undesired signal in the read-out sensors 5 and 6. FIG. 4B shows the course of the field lines after the ring-shaped core 4 has been magnetically reversed by means of the previously described method. The field lines now run closed within the core 4. The strength of the magnetization corresponds typically to the remanence of the material of the core 4.

This first method can be carried out before each measurement of the external magnetic field or only occasionally.

Method 2.1

This second method is carried out for each measurement of the external magnetic field. A measurement consists of two individual measurements. The measurement takes place in accordance with the following steps:

a) A direct current pulse I(t) is applied to the excitation coil 3 whereby the current flows through the excitation coil 3 in a first direction.

b) The output signals are read out from the read-out sensors 5 and 6.

c) A direct current pulse I(t) is applied to the excitation coil 3 whereby the current flows through the excitation coil 3 in the direction opposite to the first direction.

d) The output signals are read out from the read-out sensors 5 and 6.

e) The output signals read out from the read-out sensor 5 in steps b and d are added and the measured output signals of the read-out sensor 6 are added.

With this method, the influence of any magnetic dispersion occurring locally in the area of the Hall elements 10 to 13 that is caused by non-homogeneity of the material of the ferromagnetic core 4 can be reduced as the magnetic dispersion with the first individual measurement forms a positive contribution to the output signals and with the second individual measurement a negative contribution to the output signals that cancel each other out on the summation in step e.

The methods 1.2 and 2.2 relate to the second embodiment and their effects are described for the second embodiment whereby the terms and references relate to the figures assigned to the second embodiment.

Method 1.2

With this method, a direct current I(t) is applied to the excitation coil 3 for a predetermined time duration. The direct current I(t) flowing in the flat coil 15 causes a magnetization of the ferromagnetic core 4 in radial direction. The course of the field lines of the magnetization is represented with arrows 21 in FIG. 5 that presents a section in the z plane. With the flat coil 15, the ferromagnetic core 4 can be magnetized in an efficient way. With this magnetization, the field lines do not close within the ferromagnetic core 4. The radial magnetization produces a non-vanishing magnetic field outside the ferromagnetic core 4. This magnetic field is however symmetrical to the axis of symmetry of the ferromagnetic core 4. The field lines of this magnetic field run in the same direction for all Hall elements 10-13 and therefore produce the same Hall voltage in all Hall elements 10-13. Because the read-out sensors 5, 6 each consist of 2 oppositely coupled Hall elements, these Hall voltages make no contribution to the output signals of the read-out sensors 5, 6.

Method 2.2

With this method, an alternating current is applied to the excitation coil 3. The flat coil 15 and the electrically conductive ferromagnetic core 4 work as a transformer whereby the flat coil 15 forms the primary winding with N turns and the transformer the secondary winding with one single turn. With ideal coupling therefore, the alternating current induced in the ferromagnetic core 4 is N times greater than the alternating current flowing through the flat coil 15. The alternating current induced in the ferromagnetic core 4 causes an alternating magnetization of the core 4 the field lines of which take the course of those presented in FIG. 6. These field lines close within the ferromagnetic core 4.

The methods 1.3 and 2.3 relate to the third embodiment and their effects are described for the third embodiment whereby the terms and references relate to the figures assigned to the third embodiment. The current flowing through the additional coil produces a circular magnetic field in the ferromagnetic core 4 that is superimposed on the magnetic field formed by the flat coil 15. The resulting effect is dependent on whether a direct current or an alternating current is applied to the excitation coil 3 formed by the flat coil 15 and the bond wire 8.

Method 1.3

A direct current is applied to the excitation coil 3 (as with methods 1.1 and 2.1). Thanks to the flat coil 15, the ferromagnetic core 4 is magnetized in an efficient way as with the method 1.2 for the second embodiment. The additional coil additionally causes a circular magnetic field in the ferromagnetic core 4 as with the first embodiment. The resulting magnetization of the ferromagnetic core 4 is now no longer radial but has an additional tangential component. This state of magnetization is shown in FIG. 7. FIG. 7 shows a plan view of the ferromagnetic core 4. The local direction of the magnetization is represented by arrows 21. When the direct current is switched off, then the magnetization in the individual magnetic domains of the ferromagnetic core 4 turns in tangential direction so that the magnetic field lines close. On switching off the direct current, a circular magnetization of the ferromagnetic core 4 is therefore automatically set that, as already mentioned earlier, has the advantage that its magnetic field produces no signal in the read-out sensors 5, 6.

For the additional coil, instead of the single winding realised by the bond wire 8, several windings can be provided that, as with the first embodiment, are realised for example by conductor paths and bond wires. The number of windings of the flat coil 15 and the number of windings of the additional coil are to be adapted to one another so that the circular magnetization can be achieved with a minimum of energy.

Method 2.3

When an alternating current with constant amplitude is applied to the excitation coil 3, then the magnetic domains within the ferromagnetic core 4 have helical alignment. If the alternating current is switched off then the magnetic domains turn automatically so that the field lines of the magnetic field produced by them can close. In this way, a circular magnetization of the ferromagnetic core 4 can be achieved as with the method 1.3.

With the described embodiments horizontal Hall elements 10-13 are used as sensors for measuring the external magnetic field. However, instead of the horizontal Hall elements 10-13 it is also possible to use so-called vertical Hall elements that are sensitive to a magnetic field that runs parallel to the surface. From FIG. 2 it follows that, instead of on the outer edge underneath the ferromagnetic core 4, the vertical Hall elements have to be arranged somewhat outside the ferromagnetic core 4 where the field lines run almost horizontally. Furthermore, instead of the Hall elements, magneto-resistive sensors or magneto-transistors can also be used. However it must then be checked whether the magnetization produced in the ferromagnetic core 4 has the same influence on such a sensor as on a horizontal Hall element.

What is claimed is:

1. A magnetic field sensor for the measurement of at least one component of a magnetic field, comprising
   a ring-shaped ferromagnetic core attached to a semiconductor chip that spans a plane with the at least one component of the magnetic field to be measured and that serves as magnetic field concentrator, whereby the ferromagnetic core is magnetized with a predetermined magnetization,
   a read-out sensor, whereby the read-out sensor comprises at least one sensor that is integrated into the semiconductor chip and arranged in the vicinity of an outer edge of the ferromagnetic core and that measures the at least one component of the magnetic field,
   an excitation coil and a first electronic circuit for the temporary application of a current to the excitation coil in order to restore the predetermined magnetization in the ferromagnetic core, wherein said predetermined magnetization produces no signal in the read-out sensor, and
   a second electronic circuit for the operation of the first electronic circuit, the read-out sensor and for processing a signal delivered by the read-out sensor.

2. The magnetic field sensor of claim 1, wherein the ferromagnetic core is circularly magnetized.

3. The magnetic field sensor according to claim 2, wherein the excitation coil comprises at least one winding that encloses the ring of the ferromagnetic core.

4. The magnetic field sensor according to claim 2, wherein the read-out sensor comprises at least one Hall element.

5. The magnetic field sensor according to claim 2, wherein a width of the ring of the ferromagnetic core amounts to less than five percent of a diameter of the ferromagnetic core and wherein a height of the ring of the ferromagnetic core amounts to less than five percent of the diameter of the ferromagnetic core.

6. The magnetic field sensor according to claim 2, wherein the read-out sensor comprises two Hall elements that are arranged at diametrically opposite locations in relation to an axis of symmetry of the ferromagnetic core.

7. The magnetic field sensor according to claim 6, wherein a width of the ring of the ferromagnetic core amounts to less than five percent of a diameter of the ferromagnetic core and wherein a height of the ring of the ferromagnetic core amounts to less than five percent of the diameter of the ferromagnetic core.

8. The magnetic field sensor according to claim 1, wherein the excitation coil comprises at least one winding that encloses the ring of the ferromagnetic core.

9. The magnetic field sensor according to claim 8, wherein the read-out sensor comprises at least one Hall element.

10. The magnetic field sensor according to claim 8, wherein the read-out sensor comprises two Hall elements that are arranged at diametrically opposite locations in relation to an axis of symmetry of the ferromagnetic core.

11. The magnetic field sensor according to claim 8, wherein a width of the ring of the ferromagnetic core amounts to less than five percent of a diameter of the ferromagnetic core and wherein a height of the ring of the ferromagnetic core amounts to less than five percent of the diameter of the ferromagnetic core.

12. The magnetic field sensor according to claim 1, wherein the read-out sensor comprises at least one Hall element.

13. The magnetic field sensor according to claim 1, wherein the read-out sensor comprises two Hall elements that are arranged at diametrically opposite locations in relation to an axis of symmetry of the ferromagnetic core.

14. The magnetic field sensor according to claim 13, wherein a width of the ring of the ferromagnetic core amounts to less than five percent of a diameter of the ferromagnetic core and wherein a height of the ring of the ferromagnetic core amounts to less than five percent of the diameter of the ferromagnetic core.

15. The magnetic field sensor according to claim 1, wherein a width of the ring of the ferromagnetic core amounts to less than five percent of a diameter of the ferromagnetic core and wherein a height of the ring of the ferromagnetic core amounts to less than five percent of the diameter of the ferromagnetic core.

16. A method for operating a magnetic field sensor for the measurement of at least one component of a magnetic field, in which the magnetic field sensor comprises a ring-shaped ferromagnetic core having a predetermined magnetization attached to a semiconductor chip the ferromagnetic core spanning a plane with the at least one component of the magnetic field to be measured and serving as magnetic field concentrator, and a read-out sensor having at least one sensor integrated into the semiconductor chip and arranged in the vicinity of an outer edge of the ferromagnetic core whereby the read-out sensor measures the at least one component of the magnetic field, the method comprising the step of magnetizing the ferromagnetic core at specific times by temporary application of a current to an excitation coil for restoring the predetermined magnetization of the ferromagnetic core, wherein the predetermined magnetization in the ferromagnetic core produces no signal in the read-out sensor.

17. The method of claim 16, wherein the current applied to the excitation coil for restoring the magnetization of the ferromagnetic core is a direct current pulse, whereby a maximum of the direct current pulse produces a magnetic field that is greater than a coercive field strength of the material of the ferromagnetic core.

18. The method of claim 17, wherein the predetermined magnetization is a circular magnetization.

19. The method of claim 16, wherein the temporary application of current to the excitation coil at specific times comprises the steps of:

a) applying a first direct current pulse to the excitation coil, whereby the current flows through the excitation coil in a first direction with a maximum of the direct current pulse producing a magnetic field that is greater than a coercive field strength of the material of the ferromagnetic core;

b) then reading out an output signal of the read-out sensor;

c) applying a second direct current pulse to the excitation coil, whereby the current flows through the excitation coil in a second direction opposite to the first direction with the maximum of the direct current pulse producing a magnetic field that is greater than the coercive field strength of the material of the ferromagnetic core;

d) then reading out the output signal of the read-out sensor; and e) summing the output signals of the read-out sensor measured in steps b and d.

20. The method of claim 16, wherein the predetermined magnetization is a circular magnetization.

* * * * *